United States Patent
Takano et al.

(10) Patent No.: US 9,165,818 B2
(45) Date of Patent: Oct. 20, 2015

(54) METHOD FOR FORMING INSULATING FILM

(75) Inventors: Yusuke Takano, Tokyo (JP); Tatsuro Nagahara, Shizuoka (JP); Shinde Ninad, Shizuoka (JP); Takafumi Iwata, Aichi (JP)

(73) Assignee: MERCK PATENT GMBH, Darmstadt (DE)

( * ) Notice: Subject to any disclaimer, the term of this patent is extended or adjusted under 35 U.S.C. 154(b) by 95 days.

(21) Appl. No.: 13/984,925

(22) PCT Filed: Feb. 17, 2012

(86) PCT No.: PCT/JP2012/053756
§ 371 (c)(1),
(2), (4) Date: Aug. 12, 2013

(87) PCT Pub. No.: WO2012/111789
PCT Pub. Date: Aug. 23, 2012

(65) Prior Publication Data
US 2013/0323904 A1 Dec. 5, 2013

(30) Foreign Application Priority Data
Feb. 18, 2011 (JP) .................................. 2011-032897

(51) Int. Cl.
*H01L 21/76* (2006.01)
*H01L 21/762* (2006.01)
*H01L 21/02* (2006.01)
*H01L 23/532* (2006.01)
*C23C 18/12* (2006.01)

(52) U.S. Cl.
CPC ........ *H01L 21/76224* (2013.01); *C23C 18/122* (2013.01); *C23C 18/127* (2013.01); *C23C 18/1212* (2013.01); *C23C 18/1291* (2013.01); *H01L 21/02164* (2013.01); *H01L 21/02222* (2013.01); *H01L 21/02282* (2013.01); *H01L 21/02323* (2013.01); *H01L 21/02326* (2013.01); *H01L 23/5329* (2013.01); *H01L 2924/0002* (2013.01)

(58) Field of Classification Search
CPC .................................................. H01L 21/76224
USPC ......... 438/763, 779, 780, 782, 783, 790, 787, 438/794; 257/E21.546, E21.551
See application file for complete search history.

(56) References Cited

U.S. PATENT DOCUMENTS

| | | |
|---|---|---|
| 6,191,002 B1 | 2/2001 | Koyannagi |
| 6,767,641 B1 | 7/2004 | Shimizu et al. |
| 2002/0137260 A1 | 9/2002 | Leung et al. |
| 2008/0233416 A1 | 9/2008 | Takase |
| 2009/0061633 A1* | 3/2009 | Nakata et al. ................. 438/694 |

FOREIGN PATENT DOCUMENTS

| | | |
|---|---|---|
| JP | 3178412 B2 | 6/2001 |
| JP | 2001-308090 A | 11/2001 |
| JP | 2005-516394 A | 6/2005 |
| JP | 2008-202041 A | 9/2008 |

* cited by examiner

*Primary Examiner* — Sonya D McCall Shepard
(74) *Attorney, Agent, or Firm* — Mitchell Brustein

(57) ABSTRACT

[Problem] To provide a method capable of forming an insulating film having homogeneous and high bulk density and less suffering defects.
[Means for solving] A substrate surface is coated with a silicon dioxide dispersion containing silicon dioxide fine particles, a polymer, a surfactant and a dispersion medium; and then further coated with a polysilazane composition; and thereafter heated to form an insulating film.

14 Claims, No Drawings

METHOD FOR FORMING INSULATING FILM

This application is a United States National Stage Patent Application under 35 U.S.C. §371 of International Patent Application No. PCT/JP2012/053756, filed Feb. 17, 2012, which claims priority to Japanese Patent Applications No. 2011-032897, filed Feb. 18, 2011, the contents of both documents being hereby incorporated herein by reference.

TECHNICAL FIELD

The present invention relates to a method for forming insulating films in electronic devices. Specifically, this invention relates to a method for forming silicon dioxide films used for providing insulating films in electronic devices, for example, for providing inter-metal dielectric (IMD) films, pre-metal dielectric (PMD) films or shallow trench isolation structures, in manufacture of electronic devices such as semiconductor elements.

BACKGROUND ART

In an electronic device such as a semiconductor element, semiconductor parts such as transistors, resistors and the like are generally arranged on a substrate. Those parts must be electrically insulated from each other, and hence it is necessary to provide areas among the parts so as to separate them. Those areas are referred to as "isolation areas", which have been hitherto generally provided by forming an insulating film selectively on the surface of a semiconductor substrate.

Meanwhile, in the field of electronic devices, the density and integration degree have been increased in recent years. According to the increase of the density and integration degree, it has become difficult to form isolation structures minute enough to meet the needed integration degree and hence it has been required to develop new isolation structures satisfying the needs. Those new isolation structures include a trench isolation structure, which is formed by carving fine trenches on the surface of a semiconductor substrate and then filling the trenches with insulating material so as to electrically separate a part positioned on one side from another part on the other side of each trench. The structure thus separating the parts can reduce the isolation area, as compared with the conventional structures, and is accordingly effective in achieving the high integration degree required in these days.

As a method for forming the above trench isolation structure, a process is studied in which a polysilazane composition is applied and then converted into silicon dioxide (e.g., Patent documents 1 and 2). This process generally comprises the steps of: applying a polysilazane composition onto a substrate surface having a trench structure, so as to fill the trenches with the composition; hardening the composition by curing or the like, so as to convert polysilazane into silicon dioxide; and then removing excess of the silicon dioxide formed on the surface by chemical mechanical polishing (hereinafter, referred to as "CMP").

However, insulating films formed by conventional methods often cannot fully fulfill their functions because very high precision is required to produce recent semiconductor elements. For example, in the case where the substrate surface has trenches of high aspect ratios, polysilazane is often insufficiently oxidized in the trenches. That is because, although enough amounts of oxygen and moisture are necessary to oxidize polysilazane, they are often insufficiently supplied to polysilazane in the trenches, particularly, at the bottoms (which are distant from the surface) in the deep trenches. Consequently, the resultant structure is densified so insufficiently that it cannot be successfully fabricated as designed in the wet-etching treatment and the like performed later.

Further, isolation structures other than the trench isolation structure are also required to be made more precise. However, there are rooms for improvement in insulating films and the like formed by conventional methods. Specifically, for example, in the case where a polysilazane-containing composition is applied and hardened to form an inter-metal dielectric film or a pre-metal dielectric film on the surface of a substrate, problems of cracks in the film and/or of crystal defects at the interface are often caused by large volume shrinkage in the course of hardening.

PRIOR ART DOCUMENTS

Patent Documents

[Patent document 1] Japanese Patent No. 3178412 (paragraph: 0005 to 0016)
[Patent document 2] Japanese Patent Laid-Open No. 2001-308090

DISCLOSURE OF INVENTION

Problem to be Solved by the Invention

The present invention aims to improve the prior arts and thereby to provide a method capable of forming an insulating film having more homogeneous and higher bulk density and less suffering defects such as cracks.

Means for Solving Problem

The present invention resides in a method for forming an insulating film, comprising (1) a step of coating with silicon dioxide fine particles, in which a substrate is coated with a silicon dioxide dispersion containing silicon dioxide fine particles, a polymer, a surfactant and a dispersion medium;

(2) a step of coating with polysilazane, in which the substrate surface coated with the silicon dioxide dispersion is further coated with a polysilazane composition; and (3) a step of heating, in which the substrate coated with the polysilazane composition is heated, so as to covert the polysilazane into silicon dioxide and thereby to form an insulating film made of the silicon dioxide fine particles and the silicon dioxide derived from the polysilazane.

Further, the present invention also resides in a silicon dioxide fine particle dispersion used in the above method for forming an insulating film, containing silicon dioxide fine particles, a polymer, a surfactant and a dispersion medium.

Effect of the Invention

The present invention enables to form an insulating film having homogeneous and high bulk density even at the bottoms of trenches and accordingly to realize high etching durability of the film even if the trenches have high aspect ratios. In addition, the present invention can reduce cracks of the film and crystal defects at the interface.

BEST MODE FOR CARRYING OUT THE INVENTION

Embodiments of the present invention are described below in detail.

Formation Process of Insulating Film

The method of the present invention for forming an insulating film necessarily comprises three steps, each of which is explained as follows.

(1) Step of Coating with Silicon Dioxide Fine Particles

First, a substrate is prepared on which an insulating film is intended to be formed. There are no particular restrictions on the material of the substrate, and any known substrate such as a silicon substrate can be used. In the case where an intermetal dielectric film is intended to be formed, the substrate may be beforehand provided with various semiconductor parts thereon. On the other hand, in the case where a shallow trench isolation structure is intended to be formed, the substrate surface may be beforehand fabricated to form a relief structure comprising grooves and/or holes. Any method can be adopted to form the relief structure on the substrate surface. For example, it can be formed by the process described in Patent documents 1 and 2. Concrete procedures thereof are as follows.

In the first procedure, a silicon dioxide film is formed on the surface of a silicon substrate by, for example, the thermal oxidation method. The silicon dioxide film is generally made to have a thickness of 5 to 30 nm.

According to necessity, a silicon nitride film is then deposited on the formed silicon dioxide film by, for example, the low-pressure CVD method. The silicon nitride film will function as a mask in the following etching procedure or as a stop layer in the polishing procedure described later. If formed, the silicon nitride film is so deposited as to have a thickness of generally 100 to 400 nm.

The silicon dioxide or silicon nitride film thus formed is then coated with a photoresist. After dried or hardened if necessary, the photoresist coating is subjected to exposure according to a desired pattern and then developed to form the pattern. The exposure can be carried out in any manner such as mask exposure or scanning exposure. The photoresist can be also freely selected in view of resolution and the like.

By use of the formed photoresist film as a mask, the silicon nitride film and the silicon dioxide film laid thereunder are etched in order. As a result of this procedure, the desired pattern is formed on the silicon nitride film and the silicon dioxide film.

The silicon substrate is then subjected to dry-etching by use of the patterned silicon nitride and silicon dioxide films as a mask, to form trench isolation grooves.

The widths of the formed trench isolation grooves depend on the pattern used in the exposure of the photoresist coating. In general, the widths of trench isolation grooves in semiconductor elements are properly selected according to the aimed elements. However, the present invention is characterized in enabling to fill even the grooves of high aspect ratios homogeneously and densely with silicon dioxide. Accordingly, in the present invention, the groove width is preferably 5 to 50 nm, more preferably 5 to 40 nm. The aspect ratio, which is a ratio of the groove depth to the width, is preferably 3 to 100, more preferably 10 to 50.

In the next procedure, the silicon substrate thus prepared is coated with silicon dioxide fine particles, which are applied in the form of a dispersion containing silicon dioxide fine particles, a polymer, a surfactant and a dispersion medium.

There are various kinds of silicon dioxide fine particles. Examples of them include colloidal silica, fumed silica, and silica in other forms different from each other in production processes and properties. Although any of them can be used, colloidal silica is generally selected in view of availability. The size of the fine particles can be freely selected according to, for example, the method of applying the dispersion, and the relief structure formed on the substrate to be coated. However, they normally have a mean particle size of 4 to 50 μm, preferably 4 to 20 μm. In the case where an insulating film is intended to be formed on a substrate having grooves and/or holes, it is preferred to use silicon dioxide fine particles smaller than the groove widths and/or hole diameters so that the film can be evenly formed in the grooves and/or holes. Since silicon dioxide fine particles generally have size distribution, there are some small particles included therein. Accordingly, even if the adopted particles have a mean particle size larger than the groove widths and/or hole diameters, the grooves and/or holes can be filled with some of the particles. However, in order that the present invention can show its effect more remarkably, it is recommended to use silicon dioxide fine particles having a mean particle size smaller than the groove widths and/or hole diameters. In the present invention, the mean particle size is calculated from the specific surface area measured by BET method.

There are no particular restrictions on the content of the silicon dioxide fine particles in the dispersion thereof, and it can be freely determined according to the kind of the substrate to be coated, the relief structure size, the coating method, and so on. However, the content of the silicon dioxide fine particles is preferably 2 to 30 wt %, more preferably 5 to 20 wt % based on the total weight of the dispersion.

The polymer is presumed to stabilize the dispersed state of silicon dioxide fine particles and also to function as a binder after the dispersion is applied. It is preferred that the polymer be homogeneously dissolved in the dispersion medium described later and also have high affinity with the silicon dioxide fine particles and with the substrate surface. For example, if water is adopted as the dispersion medium, the polymer is preferably selected from the group consisting of acrylic acid polymer, methacrylic acid polymer, polyvinylpyrrolidone, and derivatives thereof. Concrete examples thereof include: polyvinyl alcohol, polyacrylic acid, polymethacrylic acid, polyvinylpyrrolidone, poly-α-trifluoromethyl acrylic acid, poly(vinyl methyl ether-co-maleic anhydride), poly(ethylene glycol-co-propylene glycol), poly(N-vinyl-pyrrolidone-co-vinyl acetate), poly(N-vinyl-pyrrolidone-co-vinyl alcohol), poly(N-vinyl-pyrrolidone-co-acrylic acid), poly(N-vinyl-pyrrolidone-co-methyl acrylate), poly(N-vinyl-pyrrolidone-co-methacrylic acid), poly(N-vinyl-pyrrolidone-co-methyl methacrylate), poly(N-vinyl-pyrrolidone-co-maleic acid), poly(N-vinyl-pyrrolidone-co-dimethyl maleate), poly(N-vinyl-pyrrolidone-co-maleic anhydride), poly(N-vinyl-pyrrolidone-co-itaconic acid), poly(N-vinyl-pyrrolidone-co-methyl itaconate), poly(N-vinyl-pyrrolidone-co-methyl itaconate), poly(N-vinyl-pyrrolidone-co-itaconic anhydride), and fluorinated polyethers.

Those polymers have various different molecular weights. In view of the coatability and the improvement of dispersability, the polymer used in the present invention preferably has a large molecular weight. Specifically, the weight average molecular weight is preferably 1000 or more, further preferably 2000 or more. On the other hand, however, the molecular weight is preferably not too large so that the dispersion can have proper viscosity and can be easily spread on the substrate. Specifically, the weight average molecular weight is preferably 100000 or less, further preferably 30000 or less.

There are no particular restrictions on the content of the polymer in the dispersion of silicon dioxide fine particles, and it can be freely determined according to the kind of the polymer, the kind of the substrate to be coated, the relief structure size, the coating method, and so on. However, the content of the polymer is preferably 0.05 to 3 wt %, more preferably 0.1 to 1 wt %, based on the total weight of the dispersion.

The surfactant is incorporated mainly for the purposes of improving coatability of the silicon dioxide fine particle dispersion and thereby of enabling to form an even coating thereof. The surfactant may be any of cationic surfactants, anionic surfactants, nonionic surfactants, and amphoteric surfactants. Among them, preferred are nonionic surfactants, anionic surfactants and amphoteric surfactants. Examples of the nonionic surfactants include: polyoxyethylene alkyl ethers (e.g., polyoxyethylene lauryl ether, polyoxyethylene oleyl ether, polyoxyethylene cetyl ether), polyoxyethylene fatty acid diester, polyoxyethylene fatty acid monoester, polyoxyethylene-polyoxypropylene block copolymer, acetylene glycol, and derivatives thereof (e.g., alkylene oxide adduct). Examples of the anionic surfactants include: alkyl diphenyl ether disulfonic acid, alkyl diphenyl ether sulfonic acid, alkyl benzene sulfonic acid, polyoxyethylene alkyl ether sulfonic acid, alkyl sulfonic acid, and ammonium salts and organic amine salts thereof. Examples of the amphoteric surfactants include: 2-alkyl-N-carboxymethyl-N-hydroxyethyl imidazolinium betaine, lauric acid amide propyl hydroxyl sulfone betaine.

The surfactant is preferably selected from the group consisting of alkylsulfonic acid salts and ethylene oxide type surfactants. Specifically, it is preferred to adopt surfactants of alkylsulfonic acid salts.

There are no particular restrictions on the content of the surfactant in the dispersion of silicon dioxide fine particles, and it can be freely determined according to the kind of the substrate to be coated, the relief structure size, the coating method, and so on. However, the content of the surfactant is preferably 0.01 to 5 wt %, more preferably 0.01 to 1 wt %, based on the total weight of the dispersion.

The silicon dioxide fine particle dispersion of the present invention contains a dispersion medium, which dissolves or disperses the components described above. In view of the treatability and cost, the dispersion medium is preferably water. It is particularly preferred to adopt pure water, which is obtained by removing impurities from distilled water or deionized water. According to necessity, it is possible to use solvents other than water, for example, organic solvents such as alcohols and esters.

If necessary, the dispersion medium may be a mixture of two or more substances. For example, with the aim of improving solubility of the polymer and/or of the surfactant, organic solvents such as alcohols can be supplementarily used in combination with water as a main dispersion medium.

The silicon dioxide fine particle dispersion according to the present invention can contain other additional components, if necessary. Examples of the additional components include acidic or basic compounds for pH control and thickening agents for viscosity control.

The silicon dioxide fine particle dispersion containing the above components is applied to coat the substrate. The coating method can be selected from known methods, such as, spin coating, curtain coating, dip coating and the like. Among them, spin coating is particularly preferred in consideration of the evenness of the formed coating. The thickness of the coating, that is, the thickness of the coating formed on the substrate surface in the area where the grooves are not provided, is preferably 300 nm or less, more preferably 100 to 200 nm. If necessary, it is possible to fill only the grooves with the dispersion of silicon dioxide fine particles.

(2) Step of Coating with Polysilazane

In the next step, the silicon substrate thus coated with the silicon dioxide fine particle dispersion is further coated with a polysilazane composition to form another coating. The polysilazane composition can be prepared by dissolving any known polysilazane compound in a solvent.

The polysilazane compound used in the present invention is not particularly restricted, and hence can be freely selected unless it impairs the effect of the invention. It may be either an inorganic or organic compound. Preferred examples of the polysilazane compound include a polysilazane comprising the following units (Ia) to (Ic) in combination:

(wherein each of m1 to m3 is a number indicating the polymerization degree).

It is particularly preferred for the above polysilazane to have a polystyrene-reduced weight average molecular weight of 700 to 30000.

Examples of the polysilazane compound also include: a polysilazane which has a skeleton mainly represented by the following formula (II):

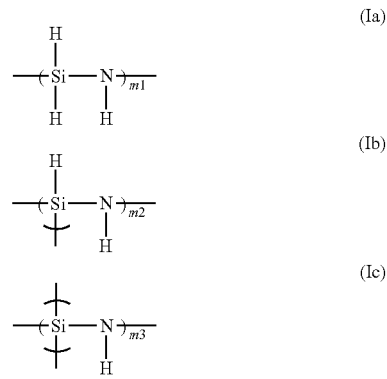

(wherein each of $R^1$, $R^2$ and $R^3$ is independently a hydrogen atom, an alkyl group, an alkenyl group, a cycloalkyl group, an aryl group, an alkylsilyl group, an alkylamino group, an alkoxy group, or another group, such as a fluoroalkyl group, which contains a carbon atom directly connecting to the silicon atom, provided that at least one of $R^1$, $R^2$ and $R^3$ is a hydrogen atom; and n is a number indicating the polymerization degree) and which has a number average molecular weight of about 100 to 50000; and modified compounds thereof. Two or more of the above polysilazane compounds can be used in combination.

The polysilazane composition used in the present invention contains a solvent capable of dissolving the above polysilazane compound. The solvent used here is different from that used in the aforementioned impregnating solution. There are no particular restrictions on the solvent as long as it can dissolve the above components. Preferred examples of the solvent include:
(a) aromatic compounds, such as benzene, toluene, xylene, ethylbenzene, diethylbenzene, trimethylbenzene and triethylbenzene; (b) saturated hydrocarbon compounds, such as n-pentane, i-pentane, n-hexane, i-hexane, n-heptane, i-heptane, n-octane, i-octane, n-nonane, i-nonane, n-decane and i-decane; (c) alicyclic hydrocarbon compounds, such as ethylcyclohexane, methylcyclohexane, cyclohexane, cyclohexene, p-menthane, decahydronaphthalene, dipentene and limonene; (d) ethers, such as dipropyl ether, dibutyl ether, diethyl ether, methyl tertiary butyl ether (hereinafter, referred to as MTBE) and anisole; and (e) ketones, such as methyl isobutyl ketone (hereinafter, referred to as MIBK). Among them, more preferred are (b) saturated hydrocarbon compounds, (c) alicyclic hydrocarbon compounds, (d) ethers and (e) ketones.

Those solvents can be used in combination of two or more, so as to control the evaporation rate, to reduce the hazardousness to the human body and to control the solubility of the components.

The polysilazane composition used in the present invention can contain other additives, if necessary. Examples of the optional additives include crosslinking accelerators that promote the crosslinking reaction of polysilazane, catalysts of the reaction converting into silicon dioxide, and viscosity modifiers for controlling viscosity of the composition. Further, when used for producing a semiconductor devise, the composition can contain a phosphorus compound such as tris(trimethylsilyl)phosphate for the sake of Na-gettering effect.

The contents of the above components depend on the coating conditions and the heating conditions. However, the polysilazane composition contains the polysilazane compound in an amount of preferably 1 to 30 wt %, more preferably 2 to 20 wt %, based on the total weight of the composition. Nevertheless, this by no means restricts the concentration of polysilazane in the polysilazane composition, and the composition having any polysilazane concentration can be adopted as long as it can form an insulating film. The content of each additive, namely, the amount of each of the various components other than polysilazane, varies according to what additive is used, but is preferably 0.001 to 40 wt %, more preferably 0.005 to 30 wt %, further preferably 0.01 to 20 wt %, based on the weight of the polysilazane compound.

The polysilazane composition can be applied on the substrate according to any coating method, such as, spin coating, curtain coating, dip coating and the like. Among them, spin coating is particularly preferred in consideration of evenness of the formed coating. The thickness of the coating, that is, the thickness of the coating formed on the substrate surface in the area where the grooves are not provided, is preferably 20 to 150 nm, more preferably 30 to 100 nm. If the coating is too thick, an even insulating film often cannot be formed in grooves in the case where the substrate surface has a relief structure. On the other hand, it should be noted that, if it is too thin, the polysilazane composition is often supplied insufficiently to fill the gaps among the silicon dioxide particles, and consequently it may be impossible to form an even insulating film.

(3) Step of Heating

After the step of coating with polysilazane, the polysilazane coating is heated to convert the whole coating into a silicon dioxide film. In the course of heating, the polysilazane is converted into silicon dioxide and unified with the silicon dioxide fine particles spread before the polysilazane composition is applied, to form an insulating film. The curing procedure is preferably carried out in a hardening furnace or on a hot-plate under an inert gas or oxygen atmosphere containing water vapor.

The water vapor is important for sufficiently converting a silicon-containing compound or a silicon-containing polymer and, if present, a polysilazane compound into silicon dioxide. The water vapor content is preferably 1% or more, further preferably 10% or more, most preferably 20% or more. It is particularly preferred that the water vapor content be 20% or more. If so, the silazane compound is smoothly converted into a silicon dioxide film and consequently defects such as voids are less formed to improve the properties of the silicon dioxide film. In the case where the inert gas is adopted as the atmospheric gas, nitrogen, argon and helium are usable.

The temperature for hardening depends on various conditions such as the kind of the used polysilazane composition and the combination of the steps. However, at a high temperature, the coated polysilazane compound is apt to be rapidly converted into a silicon dioxide film. On the other hand, at a low temperature, the silicon substrate is apt to less suffer from oxidization and the crystal structure thereof is apt to less change, and accordingly the properties of the device are less deteriorated. In view of this, the heating step is carried out at a temperature of normally 1000° C. or less, preferably 400 to 900° C. in the method according to the present invention. The rate of heating to the aimed temperature is generally 1 to 100° C./minute, and the aimed temperature for hardening is kept for generally 1 minute to 10 hours, preferably 15 minutes to 3 hours. If necessary, the temperature and atmosphere for hardening can be step-by-step changed.

The method of the present invention for forming an insulating film indispensably comprises the above (1) to (3) steps, but may further comprises the following auxiliary steps in combination.

(a) Step of Preliminary Heating

After the step of coating with silicon dioxide fine particles and before the step of coating with polysilazane, the substrate can be heated to evaporate at least a part of the solvent contained in the dispersion of silicon dioxide fine particles. This step is carried out for the purpose of removing the dispersion medium at least partly from the dispersion of silicon dioxide fine particles.

In the step of preliminary heating, the substrate is normally heated at an essentially constant temperature. This step aims to remove excess of the dispersion medium to improve the coatability of the polysilazane composition applied thereafter. Accordingly, the temperature in the step of preliminary heating should be so selected that the dispersion medium can be evaporated, and hence is properly determined according to the kind of the dispersion medium. For example, if the dispersion medium is water, the temperature is generally 90 to 120° C., preferably 100 to 110° C. The heating time is generally 3 minutes or less, preferably 0.5 to 1.5 minutes.

(b) Step of Pre-Heating

After the steps of coating and before the step of curing, the substrate coated with the polysilazane composition can be subjected to pre-heating. This step is carried out for the purpose of removing the solvent at least partly from the coating.

In the pre-heating step, the substrate is normally heated at an essentially constant temperature. This step should be carried out under the conditions that the polysilazane does not substantially undergo oxidation or polymerization. Accordingly, the temperature in the pre-heating step is in the range of normally 50 to 250° C., preferably 80 to 200° C. The time for pre-heating is generally 0.5 to 10 minutes, preferably 1 to 5 minutes.

(c) Polishing Step

After hardening the polysilazane coating, unnecessary parts of the formed silicon dioxide film are preferably removed. Particularly in forming a trench isolation structure, the silicon dioxide film formed on the flat surface of the substrate is removed by polishing while that formed in the grooves is left. This procedure is a polishing step. The polishing step may be carried out after the hardening treatment or immediately after pre-baking if the pre-baking step is performed in combination.

The polishing step is generally performed according to a CMP process. The CMP process can be carried out by use of normal abrasives and abrasive apparatus. Examples of the abrasives include silica, alumina, ceria, and aqueous suspension dispersing those and, if necessary, other abrasives. The abrasive apparatus is, for example, a commercially available normal CMP apparatus.

(d) Etching Step

As a result of the above polishing step, the silicon dioxide film formed from the polysilazane composition is almost removed from the flat surface of the substrate. However, for removing the residual silicon dioxide film on the flat surface, etching treatment can be performed. In the etching treatment, etching solution is generally used. There are no particular restrictions on the etching solution as long as it can remove the residual silicon dioxide film. The etching solution is normally a hydrofluoric acid aqueous solution containing ammonium fluoride. The content of ammonium fluoride in the solution is preferably 5% or more, more preferably 30% or more.

The present invention is further explained below by use of the following examples.

Example 101

First, a silicon substrate was prepared. The substrate was provided with a trench structure on the surface, and the width and depth of the trenches were 50 nm and 570 nm, respectively (aspect ratio: about 11).

Subsequently, colloidal silica having a mean particle size of 12 nm (PL-1 [trademark], manufactured by FUSO CHEMICAL CO., LTD.) was prepared and then mixed with pure water as the dispersion medium, polyacrylic acid (Aron® A-210 [trademark], manufactured by TOAGOSEI CO., LTD.; weight average molecular weight: about 3000) as the polymer, and dodecylbenzenesulfonic acid as the surfactant. The mixture was stirred to disperse the colloidal silica, to prepare a dispersion of silicon dioxide fine particles. The amounts of the components were as set forth in Table 1, in which the concentration of each component was shown in terms of weight percent based on the total weight of the dispersion.

The obtained dispersion of silicon dioxide fine particles was spin-coated on the above silicon substrate first at 500 rpm for 5 seconds and then at 1000 rpm for 30 seconds. Successively, preliminary heating of the substrate coated with the dispersion was conducted at 150° C. for 3 minutes, to remove the solvent.

Thereafter, the substrate was further coated with a polysilazane composition, which was prepared by dissolving perhydropolysilazane (weight average molecular weight: 3810) in dibutyl ether. The content of perhydropolysilazane was 10 wt % based on the total weight of the polysilazane composition. The composition was spin-coated first at 500 rpm for 5 seconds and then at 1000 rpm for 30 seconds.

The substrate thus coated with the polysilazane composition was pre-heated at 150° C. for 3 minutes in the atmospheric air, and then heated at 350° C. for 60 minutes in an atmosphere containing 80% water vapor so as to oxidize the polysilazane, and further subjected to additional heating at 850° C. for 60 minutes in a nitrogen gas atmosphere. In this way, an insulating film of Example 1 was obtained.

Comparative Example 100

The procedures of Example 101 were repeated except that the substrate was coated not with the dispersion of silicon dioxide fine particles but only with the polysilazane composition, to form an insulating film. The polysilazane composition used in this example contained perhydropolysilazane in an amount of 20 wt % based on the total weight of the composition.

Examples 102 to 108 and Comparative Examples 101 to 106

With the intention of forming insulating films, the procedures of Example 101 were repeated except that the components of the silicon dioxide fine particle dispersion were changed as shown in Table 1.

Evaluation

Each obtained insulating film was cut perpendicularly to the trench direction, and immersed in a 0.5% HF aqueous solution for 30 seconds. After that, the section was observed by scanning electron microscopy to evaluate the film quality in the trench. The results were as set forth in Table 1, in which the film quality was classified into the following grades:

A: the film had even quality in the trench,

B: the film had almost even quality of practical level in the trench,

C: the film had too uneven quality in the trench to use practically, and

D: the film was hardly formed in the trench.

Examples 201 to 208 and Comparative Examples 200 to 208

The procedures of Example 101 were repeated except that colloidal silica having a mean particle size of 6 nm (PL-06 [trademark], manufactured by FUSO CHEMICAL CO., LTD.) was used to prepare silicon dioxide fine particle dispersions shown in Table 2, and the formed films were evaluated in the same manner as described in Example 101. The results were as set forth in Table 2.

TABLE 1

| | Silicon dioxide conc. (%) | Surfactant Substance | Surfactant conc. (%) | Polymer Substance | Polymer conc. (%) | Film quality in trench | Notes |
|---|---|---|---|---|---|---|---|
| Ex. 101 | 6.05 | DBS | 0.01 | A-210 | 0.05 | A | The coat had a few uneven areas. |
| Ex. 102 | 6.05 | DBS | 0.01 | A-210 | 0.12 | A | |
| Ex. 103 | 6.05 | DBS | 0.01 | A-210 | 1.2 | A | The coat had a few uneven areas. |
| Ex. 104 | 6.05 | DBS | 0.01 | A-10SL | 0.32 | B | The coat had comet-shaped uneven areas, and there were a few voids in the trenches. |
| Ex. 105 | 3.05 | DBS | 0.006 | A-210 | 0.02 | A | The coat had a few uneven areas. |
| Ex. 106 | 3.01 | DBS | 0.006 | A-210 | 0.06 | A | |
| Ex. 107 | 3.01 | DBS | 0.006 | A-210 | 0.61 | A | The coat had a few uneven areas. |
| Ex. 108 | 3.01 | DBS | 0.006 | A-10SL | 0.15 | B | There were a few voids in the trenches, and the coat had a few uneven areas. |
| Com. Ex. 100 | — | — | — | — | — | C | |
| Com. Ex. 101 | 6.00 | DBS | 0.06 | — | — | D | It was impossible to form a polysilazane coat. |
| Com. Ex. 102 | 6.00 | SF-485 | 0.06 | — | — | D | It was impossible to form a polysilazane coat. |
| Com. Ex. 103 | 6.00 | — | — | A-210 | 0.06 | D | It was impossible to form a polysilazane coat. |
| Com. Ex. 104 | 6.00 | aqueous ammonia | 0.06 | — | — | D | It was impossible to form a polysilazane coat. |
| Com. Ex. 105 | 6.00 | — | — | 12 pF | 0.06 | D | It was impossible to form a polysilazane coat. |
| Com. Ex. 106 | 6.00 | — | — | A-10SL | 0.31 | D | The dispersion was clouded, and it was impossible to form a polysilazane coat. |

TABLE 2

| | Silicon dioxide conc. (%) | Surfactant Substance | Surfactant conc. (%) | Polymer Substance | Polymer conc. (%) | Film quality in trench | Notes |
|---|---|---|---|---|---|---|---|
| Ex. 201 | 6.15 | DBS | 0.012 | A-10SL | 0.31 | A | The coat had comet-shaped uneven areas, and there were a few voids in the trenches. |
| Ex. 202 | 6.05 | DBS | 0.012 | A-210 | 0.05 | A | |
| Ex. 203 | 6.05 | DBS | 0.012 | A-210 | 0.12 | A | |
| Ex. 204 | 6.05 | DBS | 0.012 | A-210 | 0.21 | A | |
| Ex. 205 | 6.05 | DBS | 0.012 | A-210 | 1.24 | A | |
| Ex. 206 | 6.10 | SF-485 | 0.012 | A-210 | 0.37 | A | |
| Ex. 207 | 3.03 | SF-485 | 0.006 | A-210 | 0.18 | A | |
| Ex. 208 | 3.11 | SF-485 | 0.006 | A-10SL | 0.19 | A | |
| Com. Ex. 100 | — | — | — | — | — | C | |
| Com. Ex. 201 | 6.25 | DBS | 0.06 | — | — | D | It was impossible to form a polysilazane coat. |
| Com. Ex. 202 | 6.20 | SF-485 | 0.06 | — | — | D | It was impossible to form a polysilazane coat. |
| Com. Ex. 203 | 6.00 | — | — | A-210 | 0.06 | D | It was impossible to form a polysilazane coat. |
| Com. Ex. 204 | 6.00 | aqueous ammonia | 0.06 | — | — | D | It was impossible to form a polysilazane coat. |
| Com. Ex. 205 | 6.20 | — | — | 12 pF | 0.31 | D | It was impossible to form a polysilazane coat. |
| Com. Ex. 206 | 6.20 | — | — | A-10SL | 0.31 | D | The dispersion was clouded, and it was impossible to form a polysilazane coat. |
| Com. Ex. 207 | 3.00 | — | — | 12 pF | 0.15 | D | It was impossible to form a polysilazane coat. |
| Com. Ex. 208 | 3.00 | — | — | A-10SL | 0.15 | D | The dispersion was clouded, and it was impossible to form a polysilazane coat. |

Remarks in the Tables

DBS: dodecylbenzenesulfonic acid,
SF-485: ethylene oxide adduct of acetylene glycol (Surfynol 485 [trademark], manufactured by Nissin Chemical Industry Co., Ltd.),
A-210: polyacrylic acid (Aron® A-210 [trademark], manufactured by TOAGOSEI CO., LTD.; weight average molecular weight: about 3000),
A-10SL: polyacrylic acid (Aron® A-10SL [trademark], manufactured by TOAGOSEI CO., LTD.; weight average molecular weight: about 6000), and
12 pF: polyvinylpyrrolidone (Kollidon 12 pF [trademark], manufactured by BASF; weight average molecular weight: about 2000).

Evaluation of Durability Against Wet-Etching

The samples of Comparative example 100 and Example 203 were evaluated on etching durability. Immediately after the polysilazane coating was formed, each sample was immersed in a 0.25% HF aqueous solution at 23° C. and then it was measured how much the silicon dioxide film was thinned down per immersing time so as to estimate the wet-etching rate.

As a result, it was found that the samples of Comparative example 100 and Example 203 had wet-etching rates of 95 Å/minute and 65 Å/minute, respectively. This indicates that the silicon dioxide film formed according to the present invention was superior to the conventionally formed silicon dioxide film in wet-etching durability, namely, in bulk density.

The invention claimed is:

1. A method for forming an insulating film, comprising
    (1) a step of coating with silicon dioxide fine particles, in which a substrate is coated with a silicon dioxide dispersion containing silicon dioxide fine particles, a polymer, a surfactant and a dispersion medium;
    (2) a step of coating with polysilazane, in which the substrate surface coated with the silicon dioxide dispersion is further coated with a polysilazane composition; and
    (3) step of heating, in which the substrate coated with the polysilazane composition is heated, so as to covert the polysilazane into silicon dioxide and thereby to form an insulating film made of the silicon dioxide fine particles and the silicon dioxide derived from the polysilazane.

2. The method according to claim 1 for forming an insulating film, wherein the step of heating is carried out at a temperature of 200 to 1500° C.

3. The method according to claim 1 for forming an insulating film, wherein the step of heating is carried out in an atmosphere containing water vapor.

4. The method according to claim 1 for forming an insulating film, wherein the weight ratio between the silicon contained in the coated silicon dioxide dispersion and that in the coated polysilazane composition is in the range of 1:15 to 6:1 per unit area of the substrate.

5. The method according to claim 1 for forming an insulating film, further comprising
    a step of additional heating, in which the substrate is further heated in an inert gas atmosphere after the step of heating.

6. The method according to claim 1 for forming an insulating film, furthermore comprising
    a step of preliminary heating, in which the substrate is heated to evaporate at least a part of the dispersion medium after the step of coating with silicon dioxide fine particles and before the step of coating with polysilazane.

7. The method according to claim 1 for forming an insulating film, wherein the substrate has a trench structure for insulating electronic parts and the formed insulating film constitutes a trench isolation structure.

8. The method according to claim 1 for forming an insulating film, wherein the insulating film serves as an inter-metal dielectric film or a pre-metal dielectric film.

9. A silicon dioxide fine particle dispersion used in the method according to claim 1 for forming an insulating film, containing
    silicon dioxide fine particles, a polymer, a surfactant and a dispersion medium.

10. The silicon dioxide fine particle dispersion according to claim 9, wherein the content of the silicon dioxide fine particles is in the range of 2 to 30 wt % based on the total weight of the dispersion.

11. The silicon dioxide fine particle dispersion according to claim 9, wherein the polymer is selected from the group consisting of acrylic acid polymer, methacrylic acid polymer, polyvinylpyrrolidone, and derivatives thereof.

12. The silicon dioxide fine particle dispersion according to claim 1, wherein the content of the polymer is in the range of 1 to 10 wt % based on the total weight of the dispersion.

13. The silicon dioxide fine particle dispersion according to claim 9, wherein the surfactant is selected from the group consisting of alkylsulfonic acids and ethylene oxide type surfactants.

14. The silicon dioxide fine particle dispersion according to claim 9, wherein the content of the surfactant is in the range of 0.01 to 5 wt % based on the total weight of the dispersion.

* * * * *